US010753959B1

(12) United States Patent
Saketi et al.

(10) Patent No.: US 10,753,959 B1
(45) Date of Patent: Aug. 25, 2020

(54) MICROSPRING PROBE CARD WITH INSULATION BLOCK

(71) Applicant: Facebook Technologies, LLC, Menlo Park, CA (US)

(72) Inventors: Pooya Saketi, Cork (IE); Christopher Percival, Blarney (IE)

(73) Assignee: Facebook Technologies, LLC, Menlo Park, CA (US)

( * ) Notice: Subject to any disclaimer, the term of this patent is extended or adjusted under 35 U.S.C. 154(b) by 197 days.

(21) Appl. No.: 16/036,627

(22) Filed: Jul. 16, 2018

Related U.S. Application Data

(60) Provisional application No. 62/667,320, filed on May 4, 2018.

(51) Int. Cl.
*G01R 1/067* (2006.01)
*G01R 1/073* (2006.01)
*G01R 31/26* (2020.01)

(52) U.S. Cl.
CPC ..... *G01R 1/06794* (2013.01); *G01R 1/06722* (2013.01); *G01R 1/07342* (2013.01); *G01R 31/2635* (2013.01)

(58) Field of Classification Search
CPC ............ G01R 1/06794; G01R 1/06722; G01R 1/07342; G01R 31/2635
See application file for complete search history.

(56) References Cited

U.S. PATENT DOCUMENTS

| 5,894,161 A * | 4/1999 | Akram | G01R 1/06711 257/417 |
| 5,956,573 A * | 9/1999 | Dinan | H01L 21/76838 438/106 |
| 6,246,247 B1 * | 6/2001 | Eldridge | B23K 20/004 257/E21.507 |
| 2002/0130676 A1 * | 9/2002 | Beaman | G01R 1/07342 324/755.08 |
| 2003/0099097 A1 * | 5/2003 | Mok | G01R 1/06716 361/767 |

(Continued)

OTHER PUBLICATIONS

Saketi, P., "Microrobotic Platform with Integrated Force Sensing Microgrippers for Characterization of Fibrous Materials: Case Study on Individual Paper Fibers," Thesis, Tampere University of Technology, Julkaisu 1309, Publication 1309, Jul. 21, 2015, 144 pages.

*Primary Examiner* — Daniel R Miller
(74) *Attorney, Agent, or Firm* — Fenwick & West LLP

(57) ABSTRACT

A probe card includes a conductive body, an insulation block, and a plurality of conductive microsprings. The insulation block covers at least one side of the body and at least partially encloses the microsprings. A first end of each microspring is connected to the conductive body and a second end is exposed from the insulation block. In operation, the probe card is moved onto one or more semiconductor devices to be tested. As the probe card is moved toward the semiconductor devices, the second ends of the conductive microsprings come into contact with contact pads on the semiconductor devices. The insulation block encloses the microsprings, which prevents the microsprings from buckling or making contact with each other. As a result, the probe card produces fewer false positives and false negatives during the testing process.

15 Claims, 8 Drawing Sheets

(56) References Cited

U.S. PATENT DOCUMENTS

| | | | |
|---|---|---|---|
| 2006/0113638 A1* | 6/2006 | Maaskant | H01L 31/035281 257/623 |
| 2007/0132466 A1* | 6/2007 | Kister | G01R 1/07371 324/756.03 |
| 2008/0112854 A1* | 5/2008 | Park | B01L 3/502707 422/400 |
| 2013/0001405 A1* | 1/2013 | Walker | G01J 1/0425 250/208.2 |

* cited by examiner

MICROSPRING PROBE CARD WITH INSULATION BLOCK

CROSS-REFERENCE TO RELATED APPLICATION

This application claims the benefit of U.S. Provisional Application No. 62/667,320, filed May 4, 2018, which is hereby incorporated by reference in its entirety.

BACKGROUND

This disclosure relates generally to a probe card for testing semiconductor devices, and more particularly to a microspring probe card with an insulation block.

A probe card is used to test semiconductor devices or circuits on a substrate by providing electrical path between a tester and semiconductor devices or circuits. Conventional probe cards typically have multiple contact elements designed as cantilevered pillars that are delicate and prone to damage during the testing process. Additional challenges arise when designing a probe card with a smaller pitch between adjacent probe tips. For instance, reducing the pitch of the probe card increases its susceptibility to short circuits and buckling, which can lead to false positives and false negatives during operation.

SUMMARY

Embodiments relate to a probe card with microsprings enclosed in an insulation block. The probe card includes a conductive body, an insulation block, and conductive microsprings. The insulation block covers at least one side of the body and at least partially encloses the microsprings. Meanwhile, each microspring has two ends. The first end is connected to the conductive body, and the second end is exposed from the insulation block. In operation, the probe card is moved onto one or more semiconductor devices to be tested. As the probe card is moved toward the semiconductor devices, the second ends of the conductive microsprings come into contact with contact pads on the semiconductor devices to form an electrical connection between the contact pad and the conductive body. A test signal can then be sent to the semiconductor devices through the conductive microsprings (e.g., by applying a test voltage to the conductive body).

In some embodiments the surface of the insulation block includes an indent where the end of each microspring protrudes, and the indent has a shape that conforms to the shape of the semiconductor devices When the probe card is moved onto the semiconductor devices, the conforming shape of the indents allows the indents to engage with the semiconductor devices to prevent undesired lateral motion of the probe card. As a result, the second ends of the microsprings can more reliably make contact with the contact pads, and the probe card is less likely to move laterally in a way that scrubs the contact pads.

The figures depict various embodiments of the present invention for purposes of illustration only. One skilled in the art will readily recognize from the following discussion that alternative embodiments of the structures and methods illustrated herein may be employed without departing from the principles of the invention described herein.

DETAILED DESCRIPTION

Structure and Operation of Microspring Probe Card

Figure 1A:
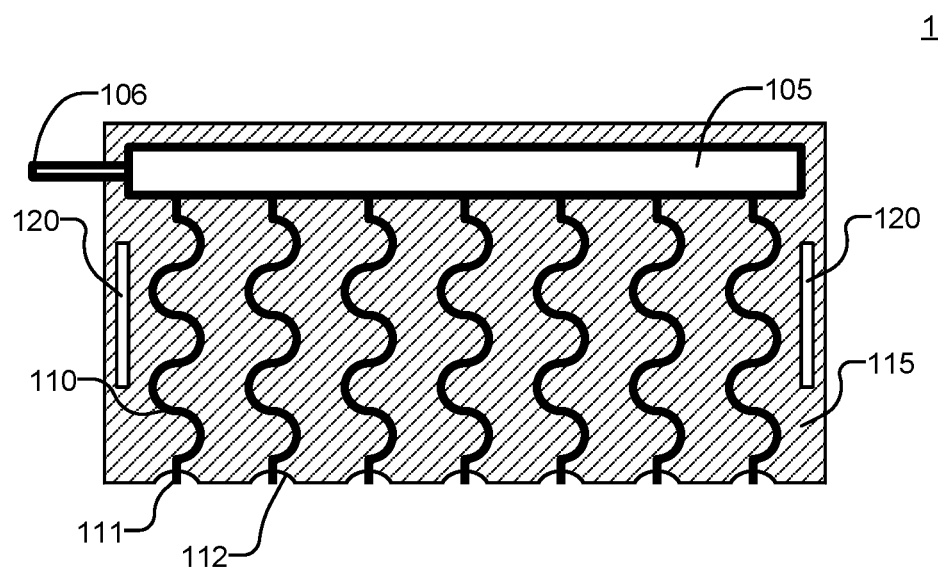
FIG. 1A is a cross-sectional view of a microspring probe card, according to one embodiment.

FIG. 1A is a cross-sectional view of a microspring probe card 100, according to one embodiment. In the embodiment shown in FIG. 1A, the probe card 100 includes a conductive body 105, a plurality of conductive microsprings 110, an insulation block 115, and strain gauges 120. As noted in further detail below, in other embodiments the probe card 100 may include additional, fewer, or different components, such as a different type of microspring or a non-conductive body rather than a conductive body.

The conductive body 105 is formed of an electrically conductive material, such as copper or gold. The conductive body 105 has an elongated shape. In other words, one dimension of the body 105 is substantially longer than the other two dimensions of the body 105. In the embodiment shown in FIG. 1A, the conductive body 105 is a rectangular prism with a length that is substantially longer than its height and its width. A pin 106 is connected to one end of the conductive body 105, and the plurality of conductive microsprings 110 are connected to an elongated surface of the body 105.

The conductive microsprings 110 are small mechanical springs (i.e., devices that exert an opposing force approximately proportional to a change in length when the device is compressed or stretched from a resting position). In various embodiments, the conductive microsprings have a length of between 10 microns (μm) and 300 μm and a width of between 3 μm and 50 μm. Furthermore, the microsprings have a cross section (also known as a microspring gauge) defined by a gauge height of between 1 μm and 20 μm and a gauge width of between 1 μm and 20 μm.

Figure 1B:
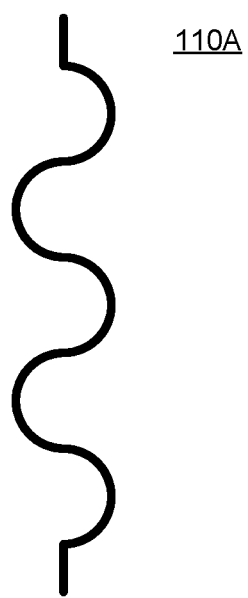
FIG. 1B illustrates a microspring for use in the probe card, according to one embodiment.
Figure 1C:
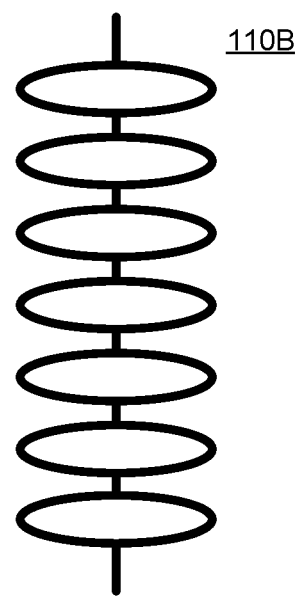
FIG. 1C illustrates a microspring for use in the probe card, according to another embodiment.

FIGS. 1B and 1C illustrate two embodiments of microsprings 110A, 110B. In the embodiment shown in FIG. 1B, the microspring 110A has multiple segments each having an S-shape or part of an S-shape. In the embodiment shown in FIG. 1C, the microspring 110B includes a plurality of ovals connected in series. In other embodiments, a different type of microspring can be used. Although the examples shown in FIGS. 1A, 2, 4A-4D and 6A-6D are shown with the S-shaped microspring 110A shown in FIG. 1B, in other embodiments the probe card 100 may instead include a different type of microspring (such as the oval-shaped microspring 110B shown in FIG. 1C) or a combination of different types of microsprings.

Referring back to FIG. 1A, the conductive microsprings 110 are formed of an electrically conductive material, such as copper or gold. Each of the microsprings 110 has two ends. One end of each microspring 110 (hereinafter referred to as the first end) is attached to a side of the conductive body 105 so that the microspring 110 is both electrically and mechanically connected to the conductive body 110. Each microspring 110 extends away from the conductive body so that the opposite end 111 of the microspring 110 (hereinafter referred to as the second end) can make contact with a contact pad on a semiconductor device during operation. Together, the conductive body 105 and the conductive microsprings 110 form a conductive path from the pin 106 to the second ends 111 of the microsprings 110 so that a testing device coupled to the pins can send a test signal to the contact pads of a semiconductor device.

The microsprings 110 are attached to the conductive body 105 with a separation distance that matches the pitch of contact pads on the semiconductor devices. In various embodiments, the conductive microsprings are separated by a pitch of between 4 μm and 12 μm. For example, the contact pads on the semiconductor devices have a pitch of approximately 10 and adjacent microsprings 110 are attached to the conductive body 105 with a separation distance of approximately 10 μm (e.g., between 8 μm and 12 μm). As another example, the contact pads on the semiconductor devices have a pitch of approximately 4.5 μm, and adjacent microsprings 110 are attached to the conductive body 105 with a separation distance of approximately 4.5 μm (e.g., between 4 μm and 5 μm).

In the embodiment shown in FIG. 1A, the probe card 100 includes a single pin 106 that is connected to all of the microsprings 110 through the conductive body 105, which means that the pin 106 controls the voltage of each of the microsprings 110. In another embodiment, the probe card 100 includes a separate pin 106 for each microspring 110 so that the microsprings 110 are individually addressable. In this embodiment, the body 105 is formed of a non-conductive material that contains traces to connect each pin 106 with a respective microspring 110.

The insulation block 115 is formed of a material with a high resilience (i.e., a material with a high ability to absorb energy when deformed elastically and release that energy upon unloading) and a low or negligible electrical conductivity. In one embodiment, the insulation block 115 is formed of an optically transparent moldable material, such as polydimethylsiloxane (PDMS).

The insulation block 115 covers at least one side of the conductive body 105 and encloses at least a portion of the conductive microsprings 110 while leaving the second ends 111 of the microsprings 110 exposed. In the embodiment shown in FIG. 1A, the insulation block 115 encloses each microspring 110 up to the second end 111, and the second end 111 of each microspring 110 protrudes from the surface of the insulation block 115 opposite to the conductive body 105 so that it can make contact with a contact pad. By enclosing the microsprings 110 in this manner, the insulation block 115 prevents the microsprings 110 from coming into contact with each other and causing short circuits. In addition, the insulation block 115 provides structural support for the microsprings 110 (which are otherwise relatively thin, flexible, and fragile), which reduces the risk that the microsprings 110 will buckle. Together, the lower risks of short circuits and buckling improve the reliability of the probe card 100 and reduces the number of false positives and false negatives that the probe card generates during operation.

The insulation block 115 can include indents 112 at the positions where the second ends 111 of each of the microsprings 115 protrude. As noted above, the pitch of the second ends 111 matches the pitch of the contact pads on the semiconductor devices being tested. As a result, the pitch of the indents also matches the pitch of the contact pads because each indent is positioned. Furthermore, the shape and dimensions of the indents 112 are selected to match the shape of the semiconductor devices being tested. As a result, when the probe card 100 is moved onto the semiconductor devices, the shape of the semiconductor devices engages with the indents 112 to guide the exposed second ends 111 to contact pads on the semiconductor devices. The manner in which the semiconductor devices engage with the indents 112 is shown in FIGS. 4A-4D and is described in further detail below with respect to these figures.

The probe card 100 may further include strain gauges 120 embedded in the insulation block 115 in an orientation that is substantially parallel to the microsprings. As described in further detail below with respect to FIG. 3, the strain gauges 120 are used during operation of the probe card to detect whether the probe card has made contact with the semiconductor devices. In other embodiments, the strain gauges 120 are omitted from the probe card 100, and a different type of sensor (e.g., a proximity sensor) is used to detect contact between the probe card 110 and the semiconductor devices.

Figure 2:
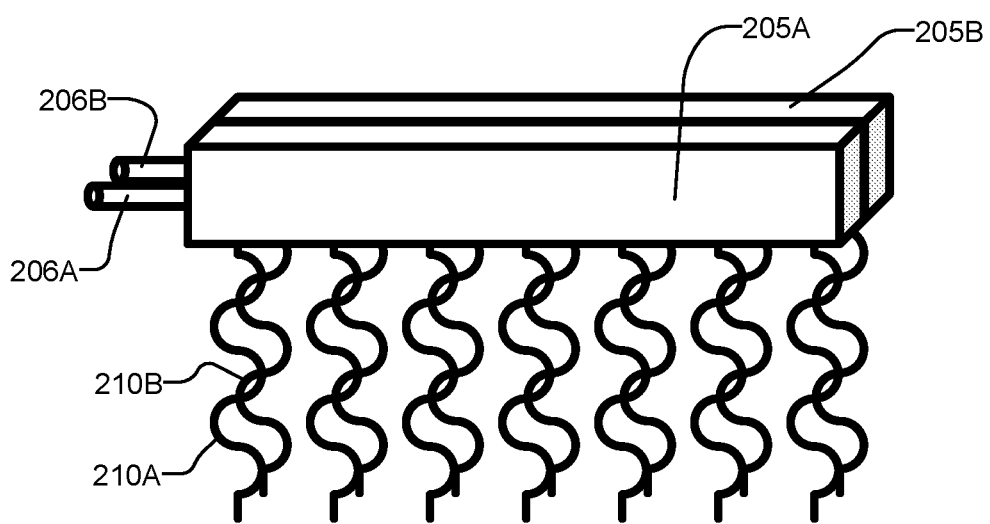
FIG. 2 illustrates a two-dimensional view a probe card comprising multiple conductive bases and multiple sets of microsprings, according to one embodiment.

FIG. 2 illustrates a two-dimensional view of a probe card 200 comprising multiple conductive bases and multiple sets of microsprings. The probe card 200 shown in FIG. 2 includes two elongated conductive bodies 205A, 205B, two pins 206A, 206B, and two sets of microsprings 210A, 210B. The conductive bodies 205, pins 206, and microsprings 210 have the same structure and functionality as the corresponding components 105, 106, 110 described above with respect to FIG. 1A. The first pin 206A and the first set of microsprings 210A are connected to the first conductive body 205A, and the second pin 206B and the second set of microsprings 210B are connected to the second conductive body 205B. The probe card 200 also includes one or more insulation blocks, but for ease of illustration, insulation blocks are not shown in FIG. 2. In one embodiment, the probe card 200 includes separate insulation blocks for each set of microsprings 210A, 210B. In another embodiment, the probe card 200 includes a single insulation block that encloses both sets of microsprings 210A, 210B.

The probe card 200 shown in FIG. 2 can be used to apply a test voltage across a pair of contact pads on a semiconductor device. The two conductive bodies 205 are arranged so that the separation distance between each microspring 210A attached to the first conductive body 205A and a corresponding microspring 210B attached to the second conductive body 205B matches the separation distance between the pair of contact pads. Thus, when the probe card 200 is moved toward the semiconductor devices, the microsprings 210A attached to the first conductive body 210A make contact with first contact pads on the semiconductor devices, and the microsprings 210B attached to the second conductive body 210B make contact with second contact pads on the semiconductor devices. A testing device can then apply a test voltage across the two pins 206A, 206B. Because the microsprings 210A, 210B are electrically coupled to their respective pins 206A, 206B, applying a test voltage across the pins 206A, 206B has the effect of applying the test voltage across the pair of contact pads on each semiconductor device.

Although the probe card 200 is only shown in FIG. 2 as having two conductive bodies 205 and two sets of microsprings 210, in some embodiments the probe card 200 includes additional conductive bodies and sets of microsprings arranged in multiple rows. In these embodiments, the probe card 200 may include a single insulation block for each set of microsprings, separate insulation blocks for set of microsprings, or separate insulation blocks that are divided among the microsprings in some other manner. In addition, although FIG. 2 illustrates a set of seven microsprings attached to each conductive body, in other embodiments the conductive bodies have a different length, and a different number of microsprings is attached to each conductive body.

By increasing the number of conductive bodies and the number of microsprings attached to each conductive body, the probe card 200 can be scaled up to make contact with a larger number of semiconductor devices at once. This is advantageous, for example, because it allows a larger number of semiconductor devices to be tested without having to re-position and re-align the probe card 200, which can reduce the overall amount of time needed to test a given number of semiconductor devices.

Figure 3:
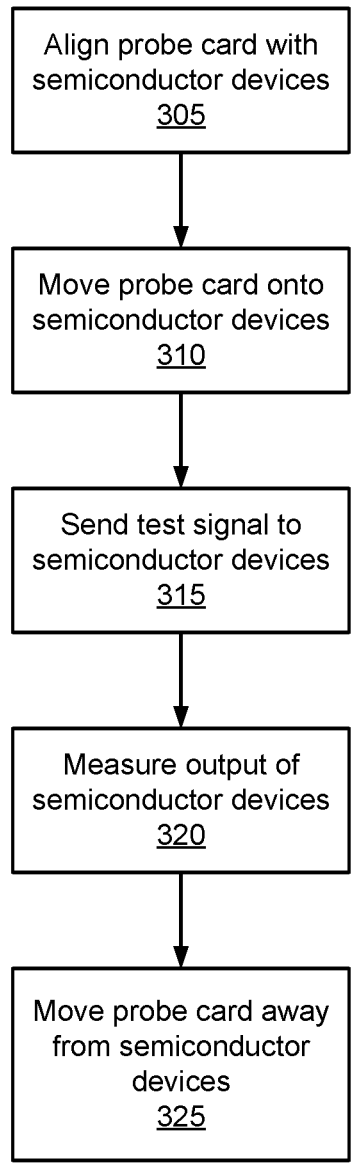
FIG. 3 is a flow chart illustrating a method for operating a microspring probe card to test semiconductor devices, according to one embodiment.
Figure 4A:
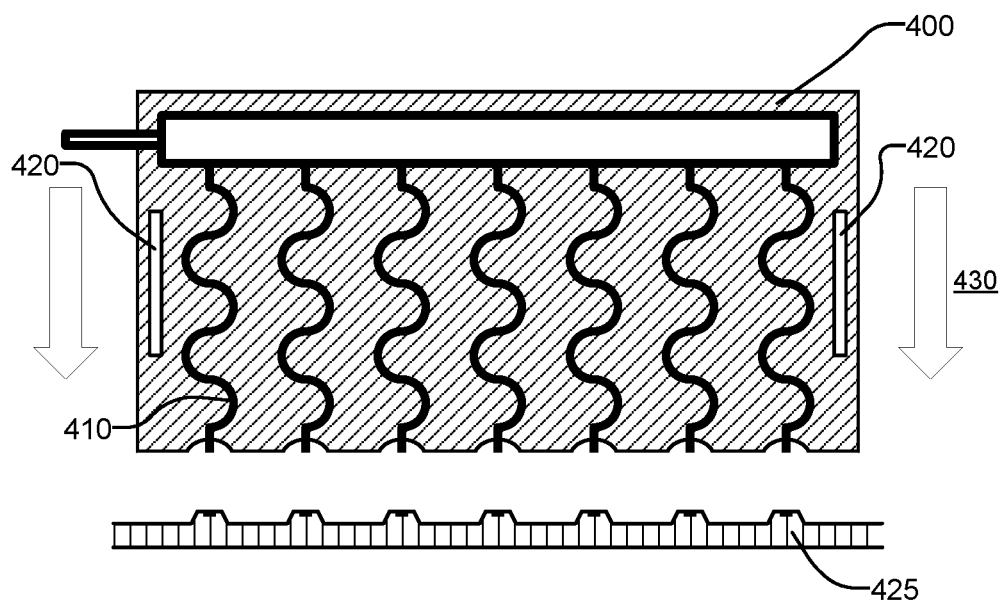
FIGS. 4A-4B are cross-sectional views illustrating a microspring probe card and semiconductor devices at various stages of a testing process, according to one embodiment.
Figure 4B:
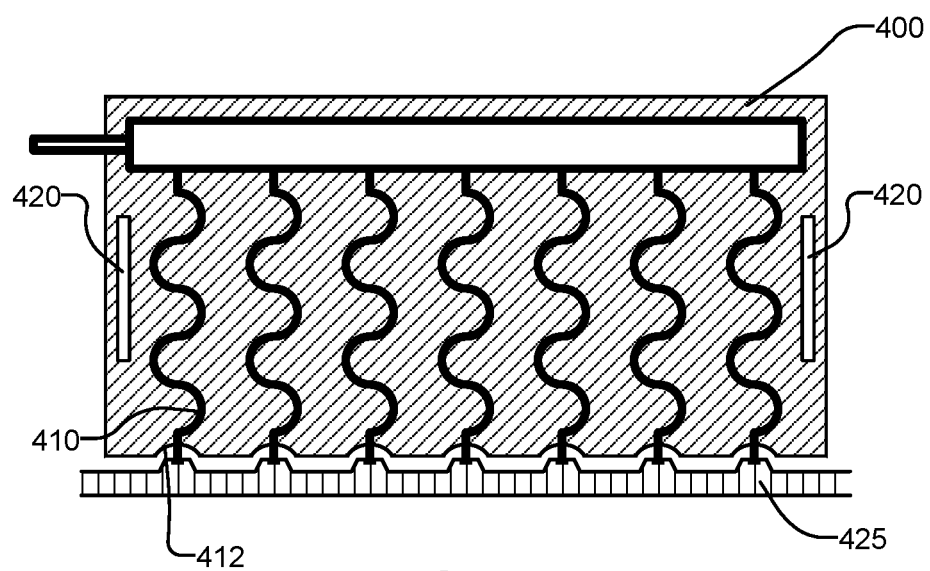
Figure 4D:
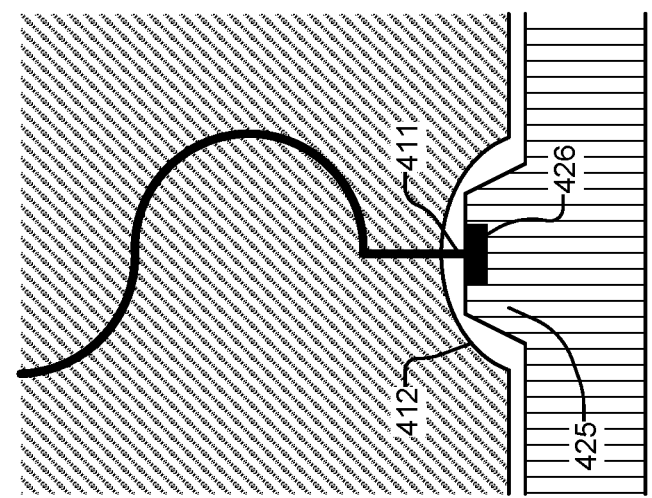
FIGS. 4C-4D illustrate close-up views of a single microspring and semiconductor device during the testing process, according to one embodiment.
Figure 4C:
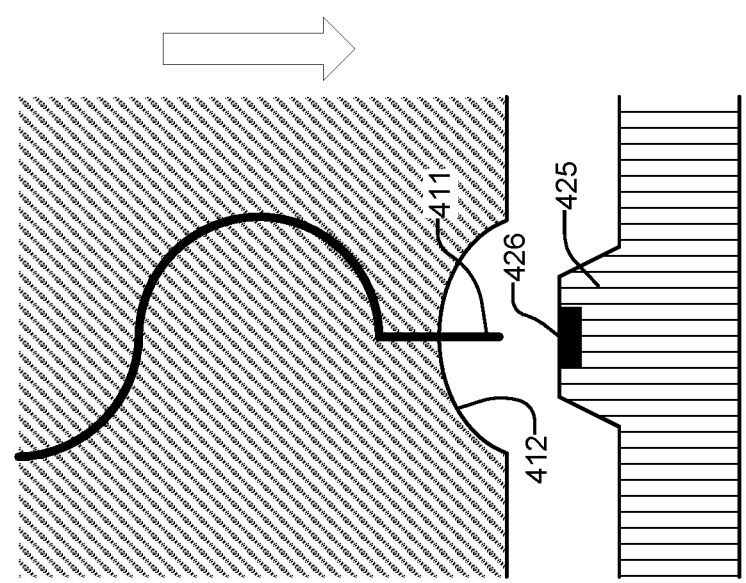

FIG. 3 is a flow chart illustrating a method for operating a microspring probe card to test semiconductor devices. In other embodiments, the method may include additional, fewer, or different steps, and the steps shown in FIG. 3 may be performed in a different order. FIGS. 4A-4B illustrate cross-sections of a microspring probe card and semiconductor devices at various stages of a testing process, and FIGS. 4C-4D illustrate close-up views of a single microspring and semiconductor device during the testing process. For ease of explanation, the method shown in FIG. 3 will be described below in conjunction with the illustrations in FIGS. 4A-4D.

The probe card 400 is aligned 305 with one or more semiconductor devices 425 to be tested. For instance, the probe card 400 is moved into a position that aligns the second ends of the microsprings are aligned with contact pads on the semiconductor devices 425. In one embodiment, the method takes place before the semiconductor devices 425 are removed from the wafer on which they were fabricated. In another embodiment, the method takes place after the semiconductor devices have been moved from the wafer to an intermediate substrate before transferring to a final target substrate. In still another embodiment, the method takes place after the semiconductor devices have been placed on a final target substrate, such as a display substrate.

After the probe card 400 is aligned 305, the probe card 400 is moved 310 onto the semiconductor devices 250 so that the second ends of the microsprings come into contact with the contact pads of the semiconductor devices 250. An example of this step 410 is shown in FIGS. 4A and 4B. In this example, the probe card 400 is positioned above the semiconductor devices 425. After the probe card 400 is aligned, the probe card 400 is lowered 430 onto the semiconductor devices 425, as shown in FIG. 4A.

FIG. 4B illustrates the probe card 400 after being moved 310 onto the semiconductor devices 425. In the embodiment shown in FIGS. 4A and 4B, the probe card 400 also includes strain gauges 420 arranged parallel to the microsprings 410. An output signal from the strain gauges 420 is monitored as the probe card 400 is moved 310 onto the semiconductor devices 425. When the output signal indicates that the probe card 400 is in contact with the semiconductor devices 425, the movement 310 of the probe card 400 is stopped. For example, when the output signal of the strain gauges 420 indicate that the strain gauges 420 are being compressed (which decreases the electrical resistance of the strain gauge 420), then it is presumed that the probe card 400 has come into contact with the semiconductor devices 425. In an embodiment where the probe card 400 includes a strain gauge 420 at each end, the output signals of both strain gauges 420 are monitored, and the movement 310 of the probe card 400 may be stopped when the output signal from both strain gauges 420, or from at least one of the two strain gauges 420, indicates that the corresponding strain gauge 420 is being compressed.

As noted above, the pitch of the indents 412 matches the pitch of the contact pads on the semiconductor devices 425, and the shape of the indents 412 is selected to match the semiconductor devices 425. Thus, the semiconductor devices 425 engage with the indents 412 when the probe card 400 is moved toward semiconductor devices 425, as shown in FIG. 4B.

FIGS. 4C and 4D illustrate close-up views of a single semiconductor device engaging with an indent 412. In the example shown in FIGS. 4C and 4D, the semiconductor device is a micro light emitting diode (microLED) 425 with a portion that is mesa shaped, and the indent 412 has a concave shape. The top of the mesa shape includes a contact pad 426 for the microLED 425. As the probe card is moved toward the microLED 425, the concave shape of the indent 412 engages with the mesa shape, which guides the second end 411 of the microspring toward the contact pad 426. As demonstrated in FIGS. 4C and 4D, the matching shapes of the indent 412 and the microLED 425 increases the reliability of the contact between the second end 411 of the microspring and the contact pad 426. In addition, the engagement between the indent 412 and the microLED 425 reduces the likelihood that the probe card will undergo lateral movement when the second end 411 is in contact with the contact pad 426. This advantageously reduces the likelihood that the second end 411 will scrub against the contact pad 426 and cause damage.

Although not shown in the cross-sections illustrated in FIGS. 4A-4D, each of the semiconductor devices can include a pair of contact pads, and moving 310 the probe card onto the semiconductor devices can cause a separate microspring to come into contact with each contact pad on each semiconductor device being tested. For instance, if the probe card shown in FIG. 2 is used, a first microspring (which is connected to the first conductive body) makes contact with the first contact pad, and a second microspring (which is connected to the second conductive body) makes contact with the second contact pad.

A test signal is sent 315 through the probe card to the semiconductor devices. For example, if the probe card shown in FIG. 2 is used, a voltage difference is applied between the first conductive body and the second conductive body (e.g., via the first and second pins). Because there is a conductive path from each conductive body to the second ends of their respective microsprings, applying the voltage difference between the two conductive bodies has the effect of applying the voltage difference to the pair of contact pads on each semiconductor device.

An output of the semiconductor devices is measured 320, and the output is used to determine which of the semiconductor devices functions properly. For example, if the semiconductor devices are microLEDs, then the output that is measured 320 is a light output of each microLED, and the microLEDs having a measured light output higher than a threshold value are presumed to function properly. The output measured may additionally or alternatively be one or more different characteristics of the microLEDs, such as impedance.

The probe card is moved 325 away from the semiconductor devices. After moving 325 the probe card away, the probe card can optionally be aligned with another set of semiconductor devices so that the testing method shown in FIG. 3 can be performed again. For example, the probe card can be operated to repeatedly perform the testing method to test each of the semiconductor devices on a single wafer.

Manufacturing Process for Microspring Probe Card

Figure 5:
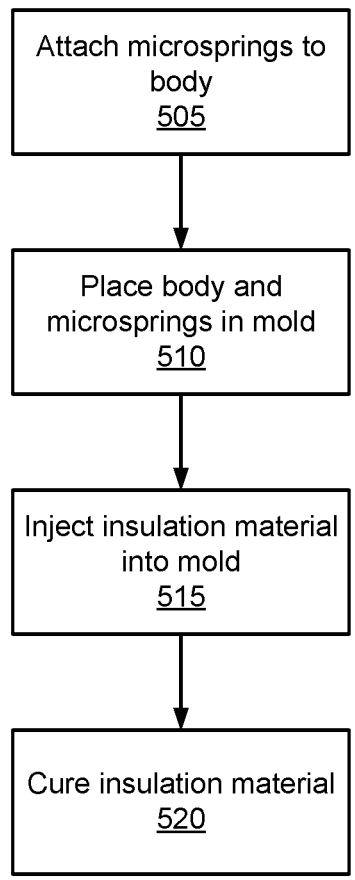
FIG. 5 is a flow chart illustrating a method for manufacturing a microspring probe card, according to one embodiment.

FIG. 5 is a flow chart illustrating a method for manufacturing a microspring probe card. In other embodiments, the method may include additional, fewer, or different steps, and the steps shown in FIG. 5 may be performed in a different order. FIGS. 6A-6D illustrate cross-sections of a microspring probe card at various stages of the manufacturing process. For ease of explanation, the method shown in FIG. 5 will be described below in conjunction with the illustrations in FIGS. 6A-6D.

A plurality of microsprings 610 are attached 505 to a conductive body 605. Referring to the illustration shown in FIG. 6A, each of the microsprings 610 are attached 505 to the conductive body 605. Attaching 505 the microsprings 610 to the conductive body 605 creates an electrical connection between first ends of the microsprings 610 and the conductive body 605 and also creates a mechanical connection that prevents the first ends of the microsprings 610 from moving relative to the body 605.

The body 605 and the microsprings 610 are placed 510 in a mold. An example of a mold 625 is shown as a dotted line in FIG. 6B. One surface of the mold 625 can include features 626 having the shape of the indents that will be formed into the surface of the insulating block. In one embodiment, the mold 625 and its included features 626 (e.g., the indents) can be fabricated with a two-photon lithography process.

Figure 6A:
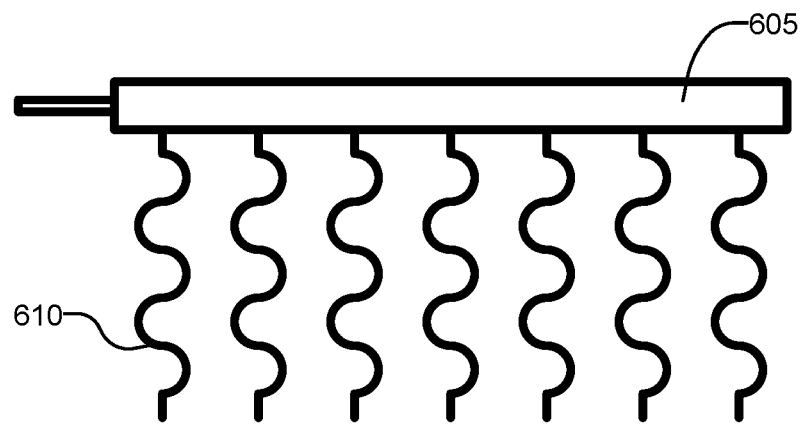
FIGS. 6A-6D are cross-sectional views illustrating cross-sections of a microspring probe card at various stages of the manufacturing process, according to one embodiment.
Figure 6B:
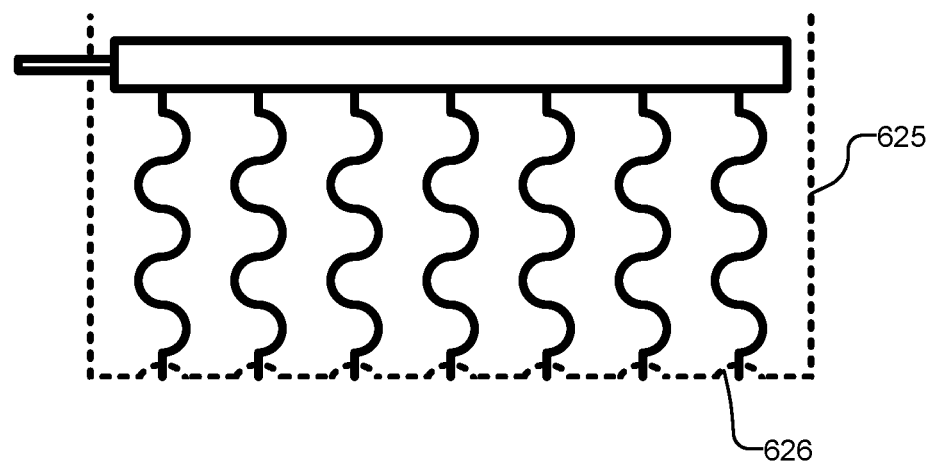
Figure 6C:
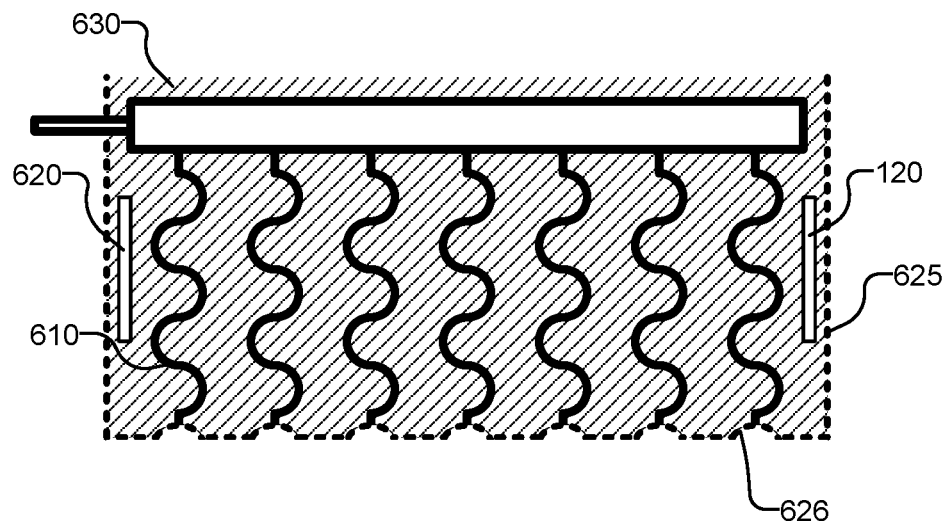
Figure 6D:
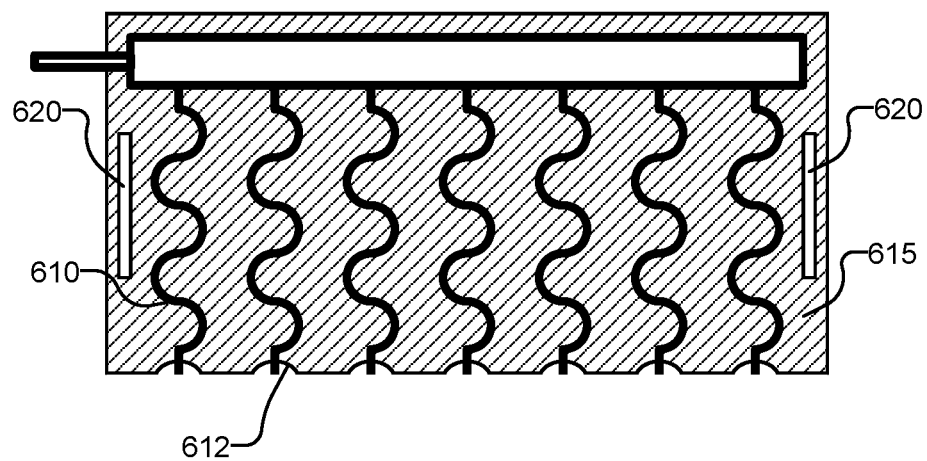

Insulation material is injected 515 into the mold, and the insulation material is cured 520 to create an insulation block. An example of the insulation material 630 after it is injected into the mold is shown in FIG. 6C, and an example probe card with an insulation block 615 that has been cured 520 is shown in FIG. 6D. As noted above with respect to FIG. 1A, the insulation material is a material with a high resilience (i.e., a material with a high ability to absorb energy when deformed elastically and release that energy upon unloading) and a low or negligible electrical conductivity, such as polydimethylsiloxane (PDMS). If the mold 625 includes features 626, then injecting 515 and curing 520 the insulation material 630 forms corresponding indents 612 in the insulation block 615. Before insulation material 630 is cured 520, one or more strain gauges 620 can be embedded in the insulation material 630 parallel to the microsprings 610 to provide the touch-down detection functions described above.

In an alternative embodiment, the insulation block is created with a 3D printing process rather than by injecting 515 the insulation material into the mold 625. In this embodiment, the 3D printing process deposits the insulation material at a resolution that is high enough to fill the spaces between the microsprings 610 and form the indents 612.

The foregoing description of the embodiments of the disclosure has been presented for the purpose of illustration; it is not intended to be exhaustive or to limit the invention to the precise forms disclosed. Persons skilled in the relevant art can appreciate that many modifications and variations are possible in light of the above disclosure.

The language used in the specification has been principally selected for readability and instructional purposes, and it may not have been selected to delineate or circumscribe the inventive subject matter. It is therefore intended that the scope of the invention be limited not by this detailed description, but rather by any claims that issue on an application based hereon. Accordingly, the disclosure of the embodiments of the invention is intended to be illustrative, but not limiting, of the scope of the invention, which is set forth in the following claims.

What is claimed is:

1. A probe card comprising:
    a conductive body;
    an insulation block covering at least one side of the conductive body, the insulation block having a surface formed with indents to receive at least portions of corresponding pads of semiconductor devices, wherein the semiconductor devices are micro light emitting diodes (LEDs), each of the microLEDs having a portion of a mesa shape, and wherein each of the indents conform to the mesa shape; and
    a plurality of conductive microsprings extending from the conductive body and partially enclosed by the insulation block to separate the conductive microsprings, the conductive microsprings having first ends connected to the conductive body and further having second ends exposed from the insulation block in the indents and configured to come in contact with the corresponding contact pads of the semiconductor devices.

2. The probe card of claim 1, wherein the insulation block is formed of a resilient material.

3. The probe card of claim 2, wherein the insulation block is formed of polydimethylsiloxane.

4. The probe card of claim 1, wherein adjacent conductive microsprings are separated by a pitch of between 4 microns (μm) and 12 μm.

5. The probe card of claim 1, further comprising:
    one or more strain gauges embedded in the insulation block to detect compression of the insulation block responsive to the second ends coming in contact with the corresponding contact pads.

6. The probe card of claim 1, further comprising:
    another conductive body;
    another insulation block covering at least one side of the other conductive body; and
    a plurality of other conductive microsprings extending from the other conductive body and partially enclosed by the other insulation block to separate the other conductive microsprings, the other conductive microsprings having first ends connected to the other conductive body and further having second ends exposed from the other insulation block and configured to come in contact with corresponding other contact pads of the semiconductor devices,
    wherein a voltage difference is applied between the conductive body and the other conductive body.

7. A method of testing semiconductor devices using a probe card, comprising:
    aligning the probe card with the semiconductor devices, wherein the semiconductor devices are micro light emitting diodes (LEDs), each of the microLEDs having a portion of a mesa shape;
    moving the probe card onto the semiconductor devices so that ends of conductive microsprings of the probe card come into contact with corresponding contact pads of the semiconductor devices, the conductive microsprings partially enclosed by an insulation block of the probe card to separate the conductive microsprings, the insulation block having a surface formed with indents to receive at least portions of corresponding pads of the semiconductor devices, each of the indents conform to the mesa shape of each of the microLEDs;

sending a test signal to the semiconductor devices through the conductive microsprings;

measuring an output of each of the semiconductor devices responsive to sending the test signals; and moving the probe card away from the one or more semiconductor devices.

8. The method of claim 7, wherein the insulation block is formed of a resilient material.

9. The method of claim 8, wherein the insulation block is formed of polydimethylsiloxane.

10. The method of claim 7, wherein adjacent conductive microsprings are separated by a pitch of between 4 microns (μm) and 12 μm.

11. The method of claim 7, further comprising:
after beginning to move the probe card toward the semiconductor devices, receiving a signal from a strain gauge embedded in the insulation block; and
responsive to the signal indicating that the probe card is in contact with the semiconductor devices, stopping the movement of the probe card.

12. The method of claim 7, wherein each of the semiconductor devices comprises a first contact pad and a second contact pad, wherein moving the probe card toward the semiconductor devices causes a first microspring connected to a first conductive body of the probe card to come into contact with the first contact pad and further causes a second microspring connected to a second conductive body of the probe card to come into contact with the second contact pad.

13. The method of claim 12, wherein sending test signals to the one or more semiconductor devices through the microsprings comprises:
applying a voltage difference between the first conductive body and the second conductive body.

14. A method of manufacturing a probe card, comprising:
attaching first ends of conductive microsprings to a side of a conductive body with second ends of the conductive microsprings facing away from the conductive body;
placing the conductive body and the conductive microsprings in a mold;
injecting an insulation material into the mold to cover the side of the conductive body and enclose at least part of the conductive microsprings with the insulation material; and
curing the insulation material after injecting the insulation material, the second ends exposed from the insulation material to come in contact with corresponding contact pads of semiconductor device to form indents into a surface of the insulation material, wherein the semiconductor devices are micro light emitting diodes (LEDs), each of the microLEDs having a portion of a mesa shape that is received in each of the indents that conform to the mesa shape.

15. The method of claim 14, further comprising embedding one or more strain gauges in the insulation material.

* * * * *